United States Patent [19]

Nakajima et al.

[11] Patent Number: 4,850,105
[45] Date of Patent: Jul. 25, 1989

[54] METHOD OF TAKING OUT LEAD OF SEMICONDUCTOR TIP PART

[75] Inventors: Kazuo Nakajima; Katsuhiko Tomita, both of Kyoto, Japan

[73] Assignee: Horiba, Ltd., Kyoto, Japan

[21] Appl. No.: 196,139

[22] Filed: May 19, 1988

[30] Foreign Application Priority Data

Jul. 4, 1987 [JP] Japan .................. 62-168378

[51] Int. Cl.$^4$ .............................................. H05K 3/30
[52] U.S. Cl. .................................. 29/841; 29/827; 357/72; 357/80
[58] Field of Search ............... 357/72, 70, 74, 80; 29/827, 841

[56] References Cited

U.S. PATENT DOCUMENTS

| | | | |
|---|---|---|---|
| 3,480,836 | 11/1969 | Aronstein | 357/80 X |
| 3,570,115 | 3/1971 | Barnes | 29/827 X |
| 4,300,153 | 11/1981 | Hayakawa et al. | 357/72 |
| 4,466,181 | 8/1984 | Takishima | 357/80 X |
| 4,635,356 | 1/1987 | Ohuchi et al. | 357/80 X |

FOREIGN PATENT DOCUMENTS

| | | | |
|---|---|---|---|
| 58-159355 | 9/1983 | Japan | 29/827 |
| 61-71649 | 4/1986 | Japan | 357/72 |
| 61-271895 | 12/1986 | Japan | 357/72 |
| 59-32161 | 2/1989 | Japan | 357/72 |

*Primary Examiner*—Timothy V. Eley
*Assistant Examiner*—Carl J. Arbes
*Attorney, Agent, or Firm*—Price, Gess & Ubell

[57] ABSTRACT

A method of removing a lead from a semiconductor tip part is provided by inserting the tip part in a through hole of a substrate. The tip part is equalized in height with substrate by adhering an adhesive tape across the through hole. A gap is left between the tip part and through hole which is filled with an insulative resin. If the substrate already has electrically conductive portions on it, a conductive paste is printed on the substrate between conductive portions and the tip part. If the substrate does not already have them, the conductive portions are formed by the addition of conductive paste on the substrate and which extends to the tip part.

14 Claims, 4 Drawing Sheets

METHOD OF TAKING OUT LEAD OF SEMICONDUCTOR TIP PART

BACKGROUND OF THE INVENTION

1. Field of the Invention

The present invention relates to a method of taking out a lead of a semiconductor tip part.

2. Description of the Prior Art

Recently, such as in an electrode for measuring ion concentration like pH, in order to reduce the size of the electrode as a whole, to reduce the cost of production, and to improve the operation and maintenance, the electrode has been constructed in the form of a sheet.

For example, a sheet-type pH-measuring electrode has been constructed by screen printing a silver paste on the surface of a substrate formed of PET (polyethylene terephthalate), which is highly insulative and inexpensive, to form an electrode and a wiring pattern. A part of the electrode is coated with AgCl to form an internal electrode portion, and a pH response membrane formed of flat plate-like response glass is affixed to the internal electrode portion through a gelatinized internal solution (for example, Japanese Utility Model Application No. 191497/1986 filed by Horiba, Ltd.).

Since the pH response membrane has a large electric resistance and a minute electric current is used as an input, the measurement is apt to be influenced by outside noise. Therefore, it is necessary to incorporate in the PET substrate a MOSFET having a large input impedance before an amplifier for amplifying a signal from the pH response membrane.

A method of incorporating a semiconductor tip part such as the MOSFET and taking out a lead includes a wire bonding method, a flip-tip method, a beam lead method, a tape carrier method and the like.

The wire bonding method has problems in that a lead portion is wanting in mechanical strength. The reliability is also low and is restricted by an increased absorption of vibration for a comparatively soft substrate such as PET substrate and is remarkably difficult for ultrasonic bonding. Methods such as the flip-tip method are highly reliable but have a disadvantage in that the manufacturing process is complicated and the cost of production is high.

SUMMARY OF THE INVENTION

The present invention was achieved in view of the above-described matters, and it is an object of the present invention to provide a method of taking out a lead of a semiconductor tip part, the method being simple in manufacturing process, inexpensive, and highly reliable.

In order to achieve the above-described object and others, a method of taking out a lead of a semiconductor tip part according to a first embodiment is characterized by having a semiconductor tip part provided with a pad portion formed therein and which is disposed in a through hole formed in an insulative substrate. A gap between the semiconductor tip part and a circumferential wall of the through hole is filled with an insulative resin. A surface of one side of the substrate is equalized to a surface of the pad portion in height. An electrically conductive paste is applied by the printing method to form an electrically conductive portion electrically connected with the pad portion on the substrate. In addition, a method of taking out a lead of a semiconductor tip part according to a second embodiment is characterized by having a semiconductor tip part provided with a pad portion formed therein and which is disposed in a through hole formed in an insulative substrate. A gap between the semiconductor tip part and a circumferential wall of the through hole is filled with an insulative resin. A surface of an electrically conductive portion formed on the substrate is equalized to a surface of the pad portion in height. An electrically conductive paste is applied by the printing method to connect the pad portion with the electrically conductive portion.

According to the above-described preferred embodiments of the present invention, since a lead of the semiconductor tip part can be taken out by the printing method, the manufacturing process is simple and inexpensive. Since the formation of the electrically conductive portion can be performed on a plane, a lead having a sufficient mechanical strength and a high reliability can be formed. In particular, according to the first embodiment, the formation of a wiring pattern and the taking out of the lead can be simultaneously performed.

BRIEF DESCRIPTION OF THE DRAWINGS

FIGS. 5a–1e a flow chart according to a first preferred embodiment of the present invention;

DESCRIPTION OF THE PREFERRED EMBODIMENTS

The preferred embodiments of the present invention are below described with reference to the drawings.

Figure 1:
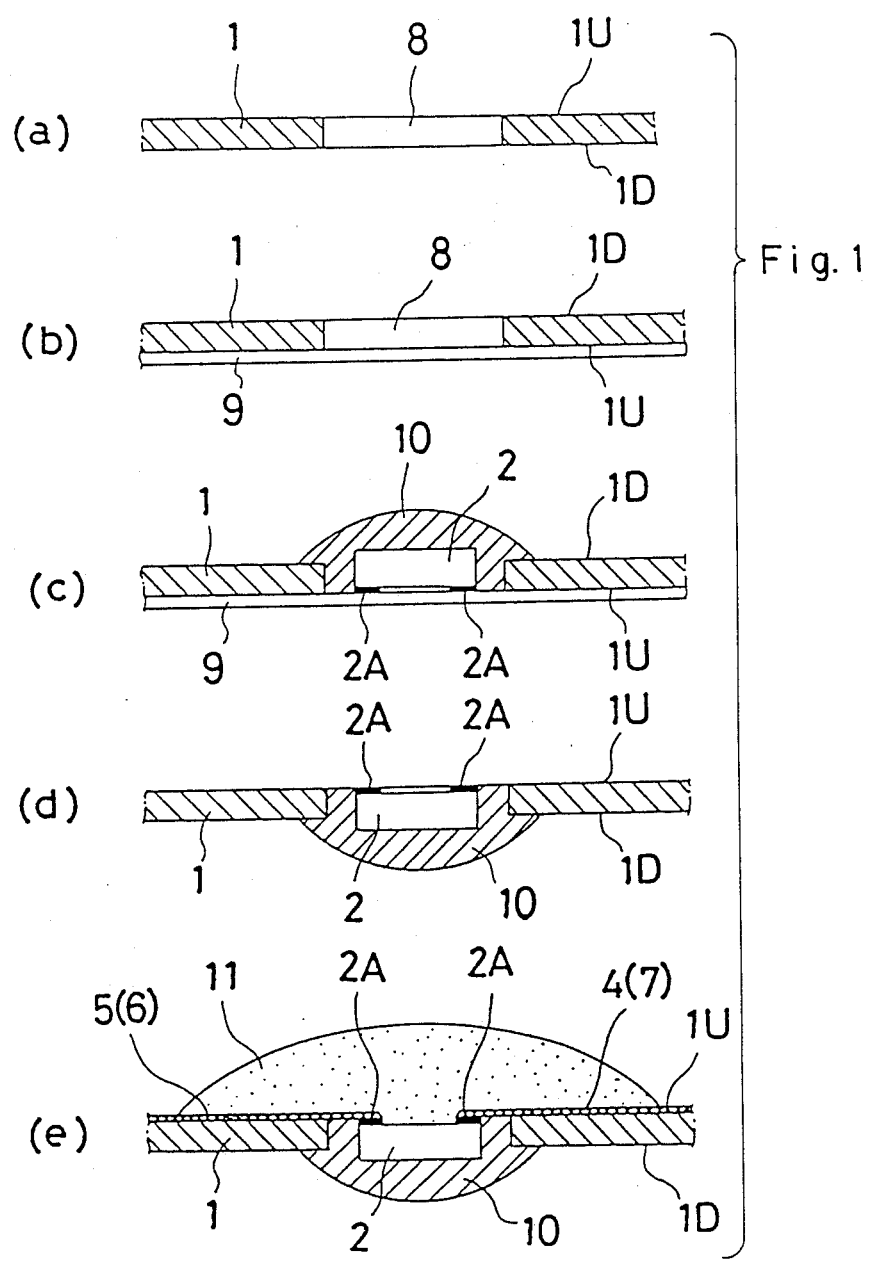
Figure 2:
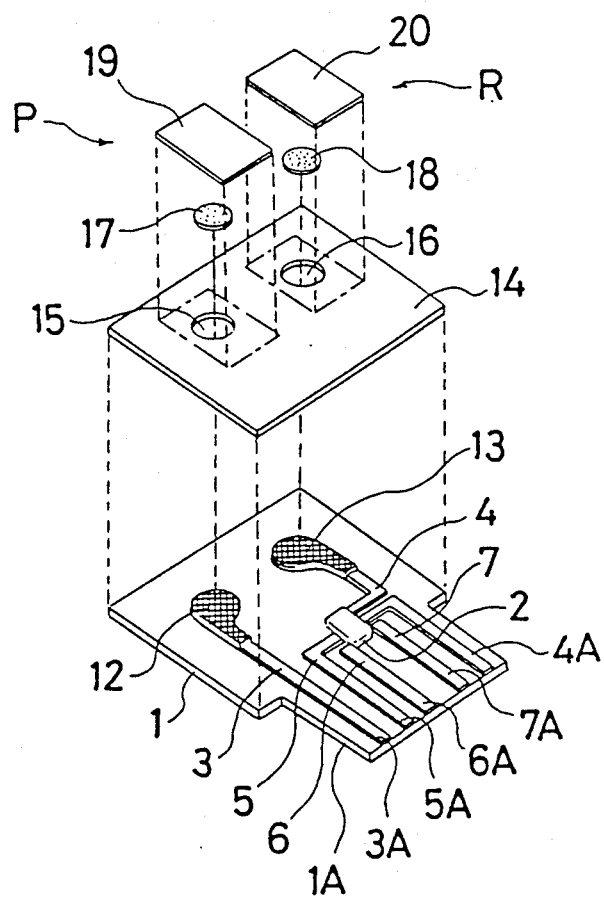
FIG. 2 is an exploded, perspective view of a sheet-type electrode for use in the measurement of pH manufactured by the method according to the first preferred embodiment of the present invention.

FIG. 1 is a flow chart showing a method according to the first preferred embodiment of the present invention, and FIG. 2 is an exploded, perspective view showing a sheet-type electrode for use in the measurement of pH and which is manufactured by the method according to the first preferred embodiment.

Referring now to FIG. 2, reference numeral 1 designates a substrate formed of a material, such as PET, having a sufficiently high insulating property even when immersed in a solution containing electrolytes. Reference numeral 2 designates a MOSFET as a semiconductor tip part incorporated in the substrate 1. Reference numerals 3, 4, 5, 6, 7 designate an electrode which is an electrically conductive portion formed on an upper surface of the substrate 1.

A method of incorporating the MOSFET 2 in the substrate 1, a method of taking out a lead, and a method of forming the electrodes 3, 4, 5, 6, 7 (referred to as the formation of a wiring pattern) are described with reference to FIG. 1.

First, a through hole 8 having an appointed size is opened at an appointed position in the substrate 1 (FIG. 1(a)).

Subsequently, an adhesive tape 9 is affixed to a surface IU of the substrate 1 to close an opening on a side of a right surface of the through hole 8 and then the substrate 1 is turned over so that a side of an opposite surface ID may be on the top (FIG. 1(b)).

The MOSFET 2 is set at an appointed position within the through hole 8 so that pad portions 2A, 2A may be engaged with the adhesive tape 9, but the MOSFET is first subjected to the following treatment.

The surface of the bare MOSFET tip is coated with a sensitive polyimide precursor under the condition of a wafer prior to dicing. The coated, sensitive polyimide precursor is then hardened by photolithography all over the surface of the MOSFET, excluding the pad portions 2A, 2A. The MOSFET tip is subjected to dicing to obtain the MOSFET 2 insulatively coated all over the surface thereof, excluding the pad portions 2A, 2A.

The MOSFET 2, which was subjected to the pretreatment in the above-described manner, is set at an appointed position within the through hole 8 so that the surface of the pad portions 2A, 2A may be brought into contact with the adhesive tape 9. A gap between a side wall of the through hole 8 and the MOSFET 2 is closely filled with an insulative resin 10 such as polyimide resin, epoxy resin, and silicone resin (FIG. 1(c)).

Upon tearing off the adhesive tape 9 and turning over the substrate 1 so that the surface IU of the substrate 1 may be on the top, the MOSFET 2 is incorporated in the substrate 1 such that the surface of the pad portions 2A, 2A is equalized to the surface 1U of the substrate 1 in height (FIG. 1(d)).

In addition, the surface IU of the substrate 1 is subjected to a grafting and an anchoring treatment by a silane coupling agent and the like. Then, an electrically conductive paste, such as Ag paste, is screen printed on the surface IU to form electrically conductive portions 4 (7), 5 (6) and the like electrically connected with the pad portions 2A, 2A. The resulting electrically conductive portions 4 (7), 5 (6) and the like are heated until hardened and then a passivation 11 is formed by the use of a silicone resin, epoxy resin and the like, whereby carrying out the incorporation of the MOSFET 2 in the substrate 1, taking out the lead and the formation of the electrodes 3, 4, 5, 6, 7 at a single stroke is accomplished (FIG. 1(e))

Referring to FIG. 2 again, reference numerals 12, 13 designate internal electrode portions of the electrodes 3, 4 and are formed in an almost central portion of the substrate 1 and coated with an electrode material such as AgCl. In addition, the other end portions of the electrodes 3, 4, 5, 6, 7 are used as lead portions 3A, 4A, 5A, 6A, 7A.

Reference numeral 14 designates a support layer formed of PET in the same manner as the substrate 1 and is provided with through holes 15, 16 at positions corresponding to the internal electrode portions 12, 13 respectively. The support layer 14 is mounted on the side of the surface IU of the substrate 1 by a thermal melting method using a splicing agent (such as polyolefinic splicing agent and silicone resin splicing agent) capable of providing a sufficiently high insulating property (for example 10 MΩ or more). An upper surface of the support layer 14 is subjected to a grafting and an anchoring treatment with a silane coupling agent and the like.

Reference numerals 17, 18 designate, for example, disk-like gelatinized internal solutions inserted in the through holes 15, 16, respectively. The solutions are formed of a basic internal solution (for example, an AgCl-supersaturated 3.3 M-aqueous solution of KCl with a phosphoric acid buffer solution added and the like) with a gelatinizer (for example, agar-agar, gelatin, glue, alginic acid, various types of acrylic water-absorbing polymer and the like) and a gel vaporization inhibitor (for example, glycerine, ethylene glycol and the like). The gelatinized internal solutions 17, 18 are filled under the condition that the upper surface thereof is slightly projected above the upper surface of the support layer 14 by the screen printing method under the condition that they are turned into a paste by, for example, heating, and disposed on the internal electrode portions 12, 13.

Reference numeral 19 designates a selective ion response membrane responsive to only a hydrogen ion, of which the lower surface thereof is contacted closely to the upper surface of the gelatinized internal solution 17. The circumference thereof is stuck to the upper surface of the support layer 14 by the use of the splicing material (for example, organic high molecular adhesives such as silicone adhesives, epoxy adhesives and urethane adhesives containing a silane coupling agent and the like) having a sufficiently high insulating property so as to seal up the gelatinized internal solution 17 in the through hole 15, and thereby construct a pH-measuring electrode P.

Reference numeral 20 designates a liquid junction membrane formed of an inorganic sintered porous substance, organic high molecular porous substance or the like impregnated with KCl, of which the lower surface thereof is contacted closely to the upper surface of the gelatinized internal solution 18. The circumference thereof is fixedly mounted on the upper surface of the support layer 14 by the use of the splicing material so as to seal up the gelatinized internal solution 18 in the through hole 17, and thereby construct a reference electrode R.

The sheet-type electrode for use in the measurement of pH constructed in the above-described manner is about 0.5 mm thick in the present preferred embodiment and housed in a casing 21 made of resins under the condition that the pH-measuring electrode P and the reference electrode R are opened toward the top. One end edge portion IA of the substrate 1, where the lead portions 3A, 4A, 5A, 6A, 7A are formed, is projected toward the outside to be formed as a tip-like electrode unit 22.

In the above-described preferred embodiment, the MOSFET 2 provided with the pad portions 2A, 2A formed therein is disposed in the through hole 8 formed in the substrate 1 having an insulating property. The gap between the MOSFET 2 and the circumferential wall of the through hole 8 is filled with an insulative resin 10. The surface 1U of the substrate 1 is equalized to the surface of the pad portions 2A, 2A in height, and the electrically conductive portions 3, 4, 5, 6, 7 being electrically connected with the pad portions 2A, 2A are formed on the substrate 1 by applying the electrically conductive paste by the screen printing method. Thereby, superior effects are exhibited in that taking out the lead of the MOSFET 2 and the formation of the wiring pattern can be simultaneously carried out. The process is simplified in comparison with the conventional method of taking out a lead so that the lead can be very easily taken out. In addition, since the electrically conductive portions 3, 4, 5, 6, 7 can be formed on a plane, a lead having a sufficient mechanical strength and high reliability can be formed.

The MOSFET 2 was incorporated in the substrate 1 and then the formation of the wiring pattern in the substrate 1 and the taking out of the lead from the MOSFET 2 were simultaneously carried out in the method according to the above first embodiment. However, the wiring pattern may be previously formed in the substrate 1 and the MOSFET 2 may be incorporated in the substrate 1 and then the lead may be taken out to connect the pad portions 2A, 2A of the MOSFET 2 with the electrically conductive portions.

Figure 3:
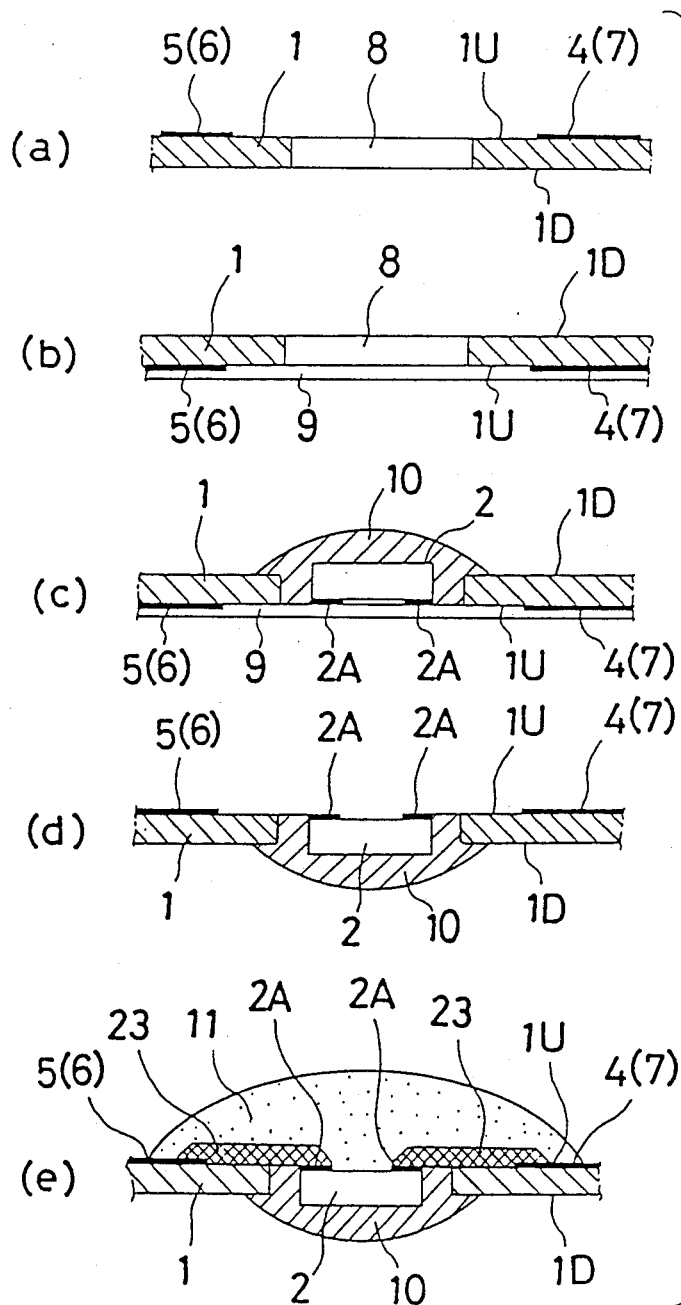
FIG. 3a–3c is a flow chart according to a second preferred embodiment of the present invention.
Figure 4:
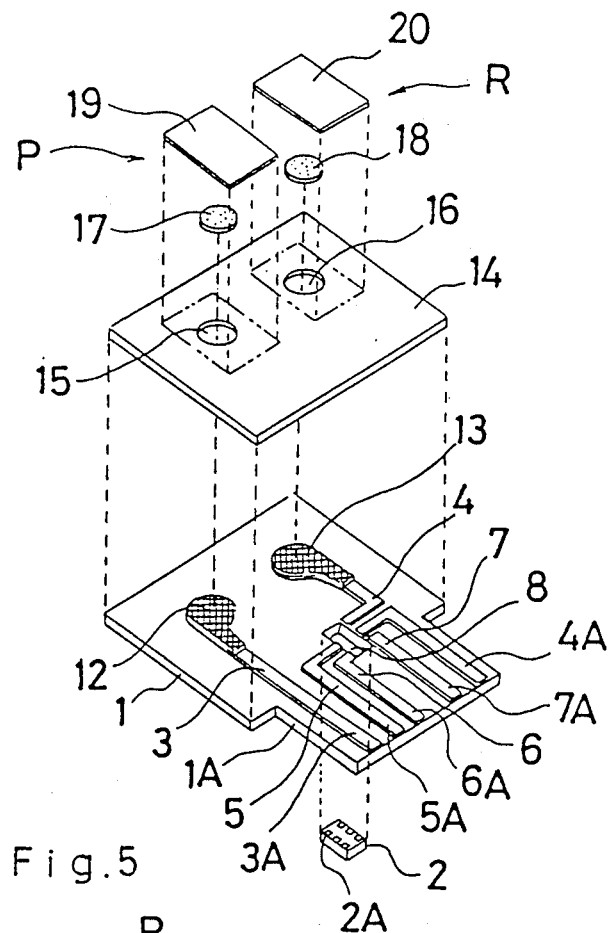
FIG. 4 is an exploded, perspective view of a sheet-type electrode for use in the measurement of pH before a semiconductor tip part is incorporated therein.
Figure 5:
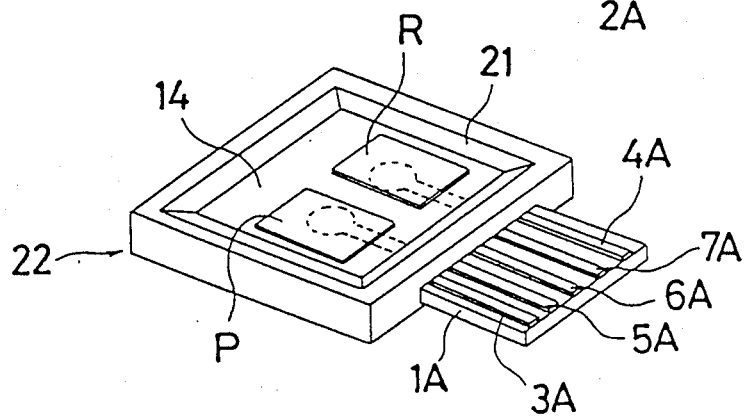
FIG. 5 is a perspective view showing an external appearance of the sheet-type electrode for use in the measurement of pH manufactured by the method according to the first or the second embodiments of the present invention.

FIGS. 3, 4 are a flow chart and an exploded, perspective view showing a method according to the second preferred embodiment of the invention in which the MOSFET 2 is incorporated in the substrate 1 and then the lead is taken out, respectively.

In the method according to the second embodiment, the electrodes 3, 4, 5, 6, 7, as the electrically conductive portions, are previously formed in the surface IU of the substrate 1 by screen printing an electrically conductive paste (FIG. 4).

The substrate 1 is provided with a through hole 8 having an appointed size opened at an appointed position thereof (FIG. 3(a)).

Subsequently, an adhesive tape 9 is stuck to electrodes 4 (7), 5 (6) from the top to close an opening on a side of a right surface of the through hole 8 and then the substrate 1 is turned over so that an opposite surface may be on the top (FIG. 3(b)).

The MOSFET 2, which was subjected to the pretreatment, is set at an appointed position within the through hole 8 so that the surface of the pad portions 2A, 2A thereof may be brought into contact with the adhesive tape 9. The MOSFET 2 is set so that the surface of the pad portions 2A, 2A may be equalized to that of the electrodes 3, 4, 5, 6, 7 of the substrate 1 in height. Then, a gap between a side wall of the through hole 8 and the MOSFET 2 is closely filled with an insulative resin 10 such as polyimide resin, epoxy resin and silicone resin (FIG. 3(c)).

Upon tearing off the adhesive tape 9 and turning over the substrate 1 so that the surface IU of the substrate 1 may be on the top, the MOSFET 2 is incorporated in the substrate 1 under the condition that the surface of the pad portions 2A, 2A is equalized to that of the electrodes 3, 4, 5, 6, 7 of the substrate 1 (FIG. 3(d)).

In addition, an electrically conductive paste, such as Ag paste, is screen printed on the surface IU of the substrate 1, which was subjected to a grafting and an anchoring treatment with a silane coupling agent and the like, to form electrically conductive portions 23, 23 connecting the pad portions 2A, 2A with the electrodes 4 (7), 5 (6). The resulting electrically conductive portions 23, 23 are heated until hardened and then a passivation 11 is formed by the use of silicone resin, epoxy resin and the like to finish the incorporation of the MOSFET 2 in the substrate 1 and the taking-out of the lead from the MOSFET 2.

According to the method of the second embodiment, the MOSFET 2 provided with the pad portions 2A, 2A formed therein is disposed in the through hole 8 formed in the substrate 1 having an insulating property. The insulative resin 10 is filled in the gap between the MOSFET 2 and the circumferential wall of the through hole 8. The surfaces of the electrodes 3, 4, 5, 6, 7 as the electrically conductive portions formed in the substrate 1 are equalized to that of the pad portions 2A, 2A in height, and the electrically conductive paste is applied by the printing method to connect the pad portions 2A, 2A with the electrodes 4 (7), 5 (6). Consequently, the process is simplified in comparison with that in the conventional method of taking out a lead, whereby the lead can be very easily taken out. In addition, since the electrically conductive portions 3, 4, 5, 6, 7 can be formed on a plane, a lead having a sufficient mechanical strength and high reliability can be formed.

In addition, various kinds of modifications to the above-described first and second embodiments can be used. For example, the substrate 1 may be formed of organic high molecular materials, such as polyethylene, polypropylene, acryl and polyfluoroethylene, and inorganic materials, such as silica glass and pyrex glass (trade name), in addition to the above-described PET.

In addition, the direct drawing method can be used as the printing method used in the formation of the electrically conductive portions in addition to the above-described screen printing. The direct drawing method leads to the possibility of forming a minute pattern.

In addition, a carbon paste, Cu paste and the like may be used as the electrically conductive paste in addition to the above-described Ag paste.

Furthermore, the method according to the present invention can be applied to the manufacture of a sheet-type electrode for use in measurement of ionic concentration other than the above-described sheet-type electrode for use in measurement of pH.

As above-described, in the method according to the present invention, a lead in a semiconductor tip part can be taken out by the printing method, so that the process is simplified, whereby cost is reduced. Since the electrically conductive portions can be formed on a plane, a lead having a sufficient mechanical strength and high reliability can be formed. The larger the number of terminals of a semiconductor tip part incorporated in the substrate, the larger the economical effect. In particular, according to the first embodiment, superior effects are exhibited in that the formation of the wiring pattern and the taking-out of the lead can be simultaneously carried out.

What is claimed is:

1. A method of taking out a lead of a semiconductor tip part, a characterized by providing a semiconductor tip part with pad portions formed therein, disposing said semiconductor tip part in a through hole formed in a substrate having an insulating property, adhering an adhesive tape across an opening of said through hole prior to the step of disposing said semiconductor tip part, leaving a gap between said semiconductor tip part and a circumferential wall of said through hole, filling said gap with an insulative resin, equalizing a surface of one side of said substrate to that of said pad portions in height, applying an electrically conductive paste by a printing method to form an electrically conductive portion electrically connected with said substrate on said substrate, and removing said adhesive tape prior to the step of applying said electrically conductive paste.

2. The method according to claim 1 further including the step of forming a passivation element over said electrically conductive portion and said semiconductor tip part.

3. The method according to claim 1 further including the step of forming a plane on which said electrically conductive portion is formed.

4. A method of taking out a lead of a semiconductor tip part, characterized by providing a semiconductor top part with pad portions formed therein, disposing said semiconductor tip part in a through hole formed in a substrate having an insulating property, adhering an adhesive tape on said substrate and across said electrically conductive portions prior to the step of disposing said semiconductor tip part, leaving a gap between said semiconductor tip part and a circumferential wall of said through hole, filling said gap with an insulative resin, equalizing a surface of electrically conductive portions formed in said substrate to that of said pad portions in height, applying an electrically conductive paste by a printing method to connect said pad portions with said electrically conductive portions, and removing said adhesive tape prior to the step of applying said electrically conductive paste.

5. The method according to claim 4 further including the step of forming a passivation element over said electrically conductive paste.

6. The method according to claim 4 further including the step of forming a plane on which said electrically conductive paste is applied.

7. A method of providing an electrical connection between a component and a substrate, comprising the steps of:
  inserting said component in a space provided in and through said substrate;
  aligning a first side of said component with a second side of said substrate by the use of an adhesive tape across said space which is removed after the step of aligning, said step of aligning thereby forming a plane;
  providing electrically conductive portions on said substrate and in said plane;
  connecting said electrically conductive portions with said component by one of the steps of directly extending said electrically conductive portions from said substrate to said component during formation of said electrically conductive portions and indirectly extending said electrically conductive portions from said substrate to said component after formation of said electrically conductive portions by the addition of an intermediary element; and
leaving said substrate to surround said component.

8. The method of claim 7 further including the step of filling said space with an insulative resin after the step of inserting said component.

9. The method of claim 7 wherein the step of connecting said electrically conductive portions includes the step of applying an electrically conductive paste on said substrate.

10. The method of claim 7 further including the step of providing pad portions on said component which can contact said electrically conductive portions.

11. A method for making a sheet-type electrode having an insulative planar substrate, an insulative planar support layer and an electrode assembly therebetween, a method of taking out a lead of a MOSFET therein, comprising the steps of:
  disposing said MOSFET in a through hole of said substrate, said MOSFET having pad portions which are positioned such that they are directly facing a planar surface of said support layer;
  leaving a gap between said MOSFET and a circumferential wall of said through hole;
  applying an insulative resin in said gap and across said MOSFET;
  equalizing a planar surface of said substrate with surfaces of said pad portions, and
  electrically connecting said pad portions to said electrode assembly by a screen printing method, whereby said substrate is left to surround said MOSFET.

12. The method according to claim 11 further including the step of applying an adhesive tape over said electrode assembly and across said through hole during the step of equalizing.

13. The method according to claim 12 wherein said tape is removed prior to the step of electrically connecting.

14. The method according to claim 11 wherein the step of applying includes the step of rendering a height of said resin beyond a height of a surface of said substrate.

* * * * *